(12) United States Patent
Kim

(10) Patent No.: US 6,316,355 B1
(45) Date of Patent: Nov. 13, 2001

(54) METHOD FOR FORMING METAL WIRE USING TITANIUM FILM IN SEMICONDUCTOR DEVICE HAVING CONTACT HOLES

(75) Inventor: Heon Do Kim, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/339,830

(22) Filed: Jun. 25, 1999

(30) Foreign Application Priority Data

Jun. 27, 1998 (KR) .................................................. 98-24584

(51) Int. Cl.⁷ .................................................. H01L 21/44
(52) U.S. Cl. ............................................ 438/656; 438/685
(58) Field of Search ............................. 438/656, 680, 438/783, 787, 628, 643, 648, 652, 653, 627, 681, 685, 694; 257/751, 758; 437/190, 192, 194

(56) References Cited

U.S. PATENT DOCUMENTS

| 5,312,775 | * | 5/1994 | Fujii et al. ............................ 437/192 |
| 5,397,962 | * | 3/1995 | Moslehi ......................... 315/111.51 |
| 5,455,197 | | 10/1995 | Ghanbari et al. . |
| 5,487,922 | | 1/1996 | Nieh et al. . |
| 5,505,834 | * | 4/1996 | Chaug et al. ...................... 204/192.3 |
| 5,512,164 | | 4/1996 | Timberlake . |
| 5,561,326 | * | 10/1996 | Ito et al. .............................. 257/751 |
| 5,580,823 | * | 12/1996 | Hegde et al. ........................ 437/192 |
| 5,581,125 | | 12/1996 | Maeda . |
| 5,604,140 | | 2/1997 | Byun . |
| 5,747,384 | * | 5/1998 | Miyamoto ............................. 438/685 |
| 5,985,759 | * | 11/1999 | Kim et al. ............................. 438/653 |
| 6,004,872 | * | 12/1999 | Tezuka et al. ....................... 438/592 |
| 6,037,278 | * | 3/2000 | Koyanagi et al. .................... 438/787 |
| 6,054,382 | * | 4/2000 | Hsu et al. ............................ 438/638 |
| 6,117,787 | * | 9/2000 | Park ..................................... 438/706 |
| 6,171,717 | * | 1/2001 | Chang et al. ........................ 428/698 |
| 6,197,686 | * | 3/2001 | Taguchi et al. ...................... 438/656 |

FOREIGN PATENT DOCUMENTS

| 2-291124 | 11/1990 | (JP) . |
| 6-120176 | 4/1994 | (JP) . |
| 7-263444 | 10/1995 | (JP) . |
| 7-263572 | 10/1995 | (JP) . |
| 7-283214 | 10/1995 | (JP) . |
| 8-186086 | 7/1996 | (JP) . |

\* cited by examiner

*Primary Examiner*—David Nelms
*Assistant Examiner*—Phuc T. Dang
(74) *Attorney, Agent, or Firm*—Jacobson Holman, PLLC

(57) ABSTRACT

A method for forming a metal wire using a titanium film in semiconductor device having contact holes according to the present invention provides excellent step coverage of a contact hole and a reliability and yield are improved. The method for forming titanium film comprises the steps of depositing a first titanium film on a wafer on conditions of a plasma density of less than $10^{10}/cm^3$, applying a bias to the wafer and depositing a second titanium film on the first titanium film on conditions of a plasma density of more than $10^{11}/cm^3$.

7 Claims, 2 Drawing Sheets ized methods have been developed. However, such methods are not sufficient enough to obtain the excellent step coverage of the contact hole. There are many developments with respect to the titanium nitride films, but not the titanium films. Actually, the titanium nitride film as a barrier does not affect the device, but the titanium film in contact with a substrate affects greatly the device since it reacts on the silicon layer on the substrate in the following process.

METHOD FOR FORMING METAL WIRE USING TITANIUM FILM IN SEMICONDUCTOR DEVICE HAVING CONTACT HOLES

FIELD OF THE INVENTION

The present invention relates to a method for fabricating semiconductor device and, more particularly, to a method for forming a titanium film having excellent step coverage using a sputtering process.

DESCRIPTION OF THE PRIOR ART

The more integrated semiconductor devices are integrated, the smaller the size of metal contact holes is and the more difficult a metal wiring process of a semiconductor device is.

In the metal wiring process, titanium/titanium-nitride (Ti/TiN) films deposited by using a physical vapor deposition (PVD) method have been used as a diffusion barrier, which serves as a barrier for inhibiting a diffusion of silicon atoms from a substrate. However, when an aspect ratio of contact holes is beyond two, it is difficult that the titanium/titanium-nitride films have good step coverage in a lower portion and a sidewall of contact hole. In order to improve such a poor step coverage of the contact hole, many physical vapor depositions (PVD) using a collimator and a ionized methods have been developed. However, such methods are not sufficient enough to obtain the excellent step coverage of the contact hole. There are many developments with respect to the titanium nitride films, but not the titanium films. Actually, the titanium nitride film as a barrier does not affect the device, but the titanium film in contact with a substrate affects greatly the device since it reacts on the silicon layer on the substrate in the following process.

One of approaches to solve such problems is to form high-density plasma in the sputtering chamber by applying RF power. And then a bias is applied to the wafer so that the sputtered titanium atoms may be incident in the direction perpendicular to the wafer and the step coverage of the lower portion of contact hole may be improved.

While the step coverage of contact hole may be improved, however, the high-density plasma and the applied bias may result in the degradation of device with a damage of substrate.

SUMMARY OF THE INVENTION

It is, therefore, an object of the present invention to provide a method for forming a metal wire using a titanium film in a semiconductor device having excellent step coverage without damage of substrate by a sputtering method and a stabilization of metal wiring process.

In accordance with an aspect of the present invention, there is provided a method for forming a metal wire using a titanium film in semiconductor device having a contact hole, the method comprising the steps of: a) depositing a first titanium film on a substrate, in which a contact hole is formed, on conditions of plasma density of less than $10^{10}/cm^3$; b) applying a bias to the substrate; and c) depositing a second titanium film on the first titanium film on conditions of plasma density of more than $10^{11}/cm^3$.

BRIEF DESCRIPTION OF THE DRAWINGS

The above and other objects and features of the present invention will become apparent from the following description of the preferred embodiments given in connection with the accompanying drawings, in which.

DETAILED DESCRIPTION OF THE PREFERRED EMBODIMENTS

Hereinafter, the present invention will be described in detail referring to the accompanying drawings.

Using a sputtering method, a deposition of titanium film is carried out under the different conditions. The present invention provides the titanium film with excellent step coverage without a damage of substrate by controlling RF power and applying a bias to the substrate. That is, in a first deposition of the titanium film, a specific thickness of it is deposited on conditions of low-density plasma and a low pressure. And then, in a second deposition of the titanium film, the rest of desired thickness is deposited on conditions of high-density plasma and an application of bias to the substrate.

That is, in forming the titanium film by using the sputtering process, the first titanium film is deposited on the substrate having the contact holes on conditions of the low-density plasma density of less than $10^{10}/cm^3$. And a bias is applied to the substrate while a second titanium film is deposited on the first titanium film on conditions of high-density plasma density of more than $10^{11}/cm^3$.

Figure 1A:
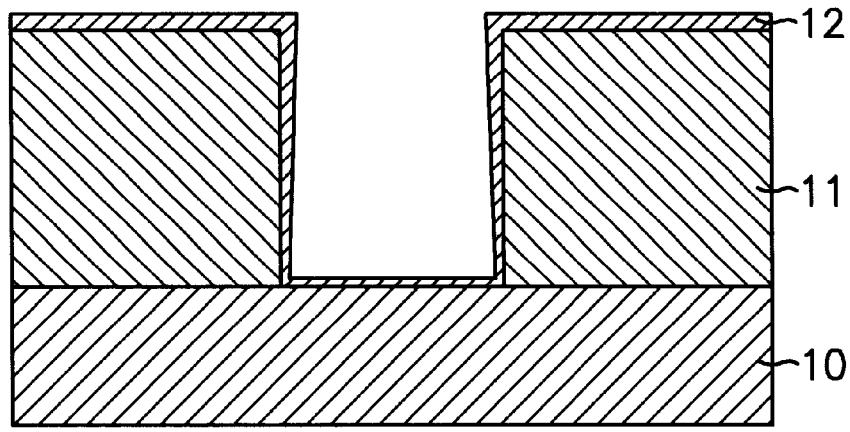
FIGS. 1A to 1D are cross-sectional views illustrating metal wiring processes in accordance with the present invention.

FIGS. 1A to 1D are cross-sectional views illustrating a metal wiring process in accordance with the present invention. Referring to FIG. 1A, an interlayer insulating layer 11 is deposited on a substrate 10 after a specific lower-layer process, and then a metal contact hole is formed by a selective etching process. A first titanium film 12 is deposited on the resulting structure of the interlayer insulating layer 11 within a sputtering apparatus on conditions of plasma density of less than $10^{10}/cm^3$ and a temperature of approximately 450° C. to 650° C. and a pressure of less than 2.0 mTorr. The thickness of the first titanium film must be less than half the desired thickness of the titanium. Compared to conventional high-density plasma deposition, the step coverage is more excellent in sidewalls of the contact hole but relatively poor in a lower portion of it. However, the substrate of the lower portion of contact hole is prevented from a damage caused by the conventional high-density plasma.

Figure 1B:
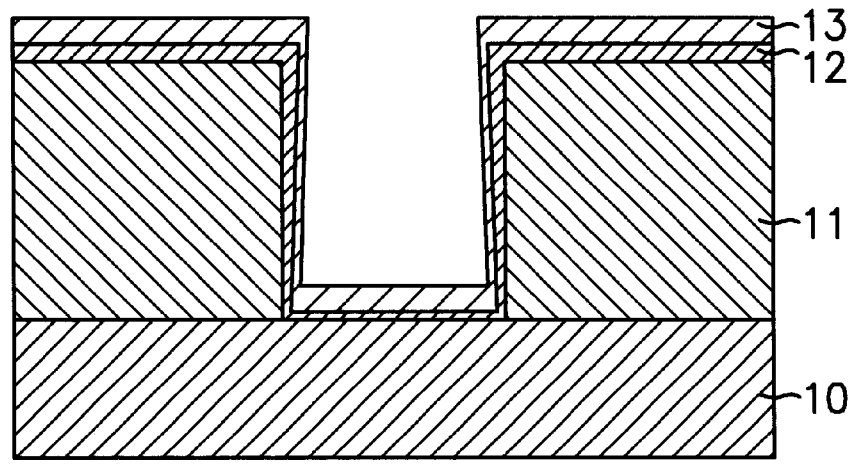

A second titanium film 13 is formed on the first titanium film 12, as shown in FIG. 1B. The rest of desired thickness is deposited on conditions of plasma density of more than $10^{11}/cm^3$ and pressure of higher than 15 mTorr, and the applied bias application to the substrate. Due to the applied bias to the substrate, the sputtered titanium particles may make straight for the first titanium film, so that the step coverage in the lower portion of contact hole is improved.

Figure 1C:
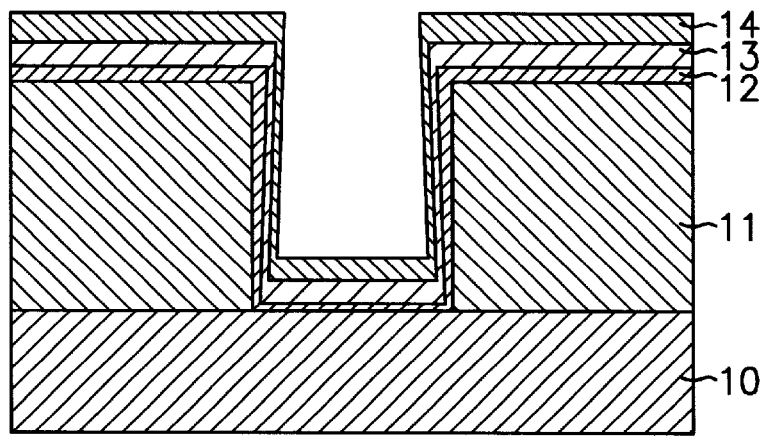

Subsequently, similar to the preceding process, a titanium nitride film 14 is deposited on the second titanium film 13 within the same chamber, as shown in FIG. 1C.

Figure 1D:
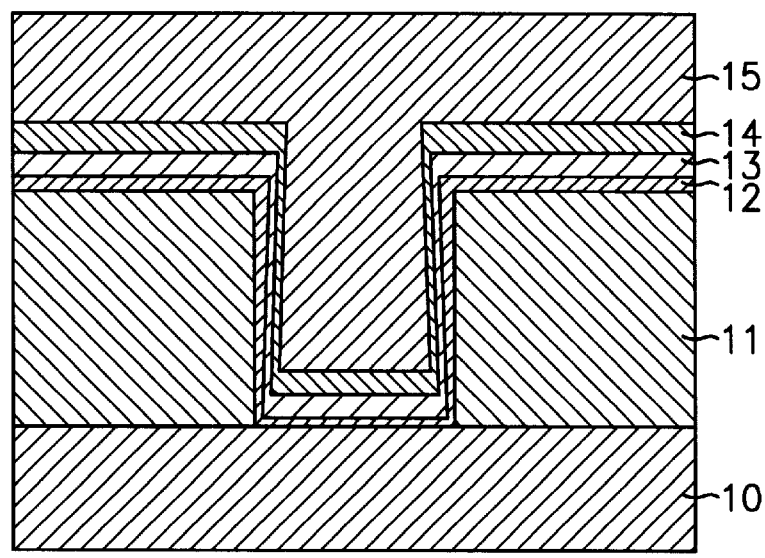

Finally, a tungsten layer 15 is deposited on the titanium nitride film 14, so that the contact hole is buried in the tungsten layer 15, as shown in FIG. 1D.

As apparent from the above, the present invention provides the titanium film with the good step coverage of contact hole, so that the metal wiring process is stabilized and the reliability and yield are greatly improved.

Although the preferred embodiment is described in forming the metal wiring, such a metal formation may be also applied to a bit line.

While the present invention has been described with respect to certain preferred embodiments only, other modifications and variation may be made without departing from the spirit and scope of the present invention as set forth in the following claims.

What is claimed is:

1. A method for forming a metal wire using a diffusion barrier film in a semiconductor device having a contact hole formed on a semiconductor substrate, the method comprising the steps of:

a) depositing a first titanium film on the contact hole by a sputtering method on conditions of a plasma density of less than $10^{10}/cm^3$; and b) depositing a second titanium film on the first titanium film by a sputtering method on conditions of a plasma density of more than $10^{11}/cm^3$.

2. The method as recited in claim 1, wherein the first titanium film is deposited at a pressure of less than 2.0 mTorr.

3. The method as recited in claim 2, wherein the first titanium film is deposited at a temperature ranging 450° C. to approximately 650° C.

4. The method as recited in claim 1, wherein the second titanium film is deposited at a pressure of more than 15 mTorr.

5. The method as recited in claimed 4, wherein the second titanium film is deposited at a temperature ranging 450° C. to approximately 650° C.

6. The method for forming the titanium film as recited in claim 1, wherein the second titaniuum film is deposited insitu.

7. The method as recited in claim 1, between the steps a) and b), further comprising a step of applying a bias to the semiconductor substrate.

* * * * *